United States Patent
Aono et al.

(10) Patent No.: US 6,822,338 B2
(45) Date of Patent: Nov. 23, 2004

(54) WIRING STRUCTURE OF SEMICONDUCTOR DEVICE

(75) Inventors: Tsutomu Aono, Tatebayashi (JP); Kikuo Okada, Kamisato-machi (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/374,727

(22) Filed: Feb. 27, 2003

(65) Prior Publication Data

US 2003/0162382 A1 Aug. 28, 2003

(30) Foreign Application Priority Data

Feb. 27, 2002 (JP) ........................................ 2002-051993

(51) Int. Cl.[7] .......................... H01L 23/48; H01L 23/52; H01L 29/40
(52) U.S. Cl. ....................... 257/784; 257/341; 257/690
(58) Field of Search ............................... 257/691, 734, 257/107, 784, 690, 341

(56) References Cited

U.S. PATENT DOCUMENTS

| | | | | |
|---|---|---|---|---|
| 5,247,425 A | * | 9/1993 | Takahasi | 361/717 |
| 5,523,620 A | * | 6/1996 | Eytcheson et al. | 257/690 |
| 5,539,220 A | * | 7/1996 | Takahashi | 257/177 |
| 6,215,185 B1 | * | 4/2001 | Kikuchi et al. | 257/747 |
| 6,448,645 B1 | * | 9/2002 | Kimura et al. | 257/735 |
| 6,479,327 B2 | * | 11/2002 | Takahashi et al. | 438/124 |
| 2002/0043708 A1 | * | 4/2002 | Muto et al. | 257/686 |
| 2002/0186545 A1 | * | 12/2002 | Fukada et al. | 361/719 |
| 2003/0132530 A1 | * | 7/2003 | Teshima et al. | 257/780 |

FOREIGN PATENT DOCUMENTS

JP          05-206449          8/1993

OTHER PUBLICATIONS

Peter Van Zant, Microchip Fabrication, 2000, McGraw Hill, Fourth Edition, 398–401 and 614.*

Charles A. Harper, Electronic Packaging and Interconnection Handbook, 2000, McGraw Hill, 5.3.1, 6.1.*

* cited by examiner

Primary Examiner—Mary Wilczewski
Assistant Examiner—Monica Lewis
(74) Attorney, Agent, or Firm—Morrison & Foerster LLP (57) ABSTRACT

A semiconductor device includes a power supply semiconductor chip that has a current passing electrode. A conductive plate is disposed on the current electrode, and a conductive wire that is used for an external connection of the device is fixed on the conductive plate, but not directly on the current passing electrode. The conductive plate may serve as a shock absorber during wire bonding procedure, and may contact more than one current passing electrodes so that the number of wire bonding procedures is reduced in manufacturing the device.

7 Claims, 11 Drawing Sheets

Prior Art

FIG.13

Prior Art

FIG.14

Prior Art

WIRING STRUCTURE OF SEMICONDUCTOR DEVICE

BACKGROUND OF THE INVENTION

1. Field of the Invention

The invention relates to semiconductor device that includes a semiconductor chip for power supply, specifically to a wiring structure of the device for external connection.

2. Description of the Related Art

Conventional power supply semiconductor devices are described, for example, in Japanese Laid-Open Patent Publication No. Hei 5-206449. As described in the publication, conventional power supply semiconductor devices relies on switching chips of standard size. To meet a specific current capacity requirement for an application of the device, the standard-size switching chips are connected in parallel to fabricate the power supply semiconductor device.

Figure 12:
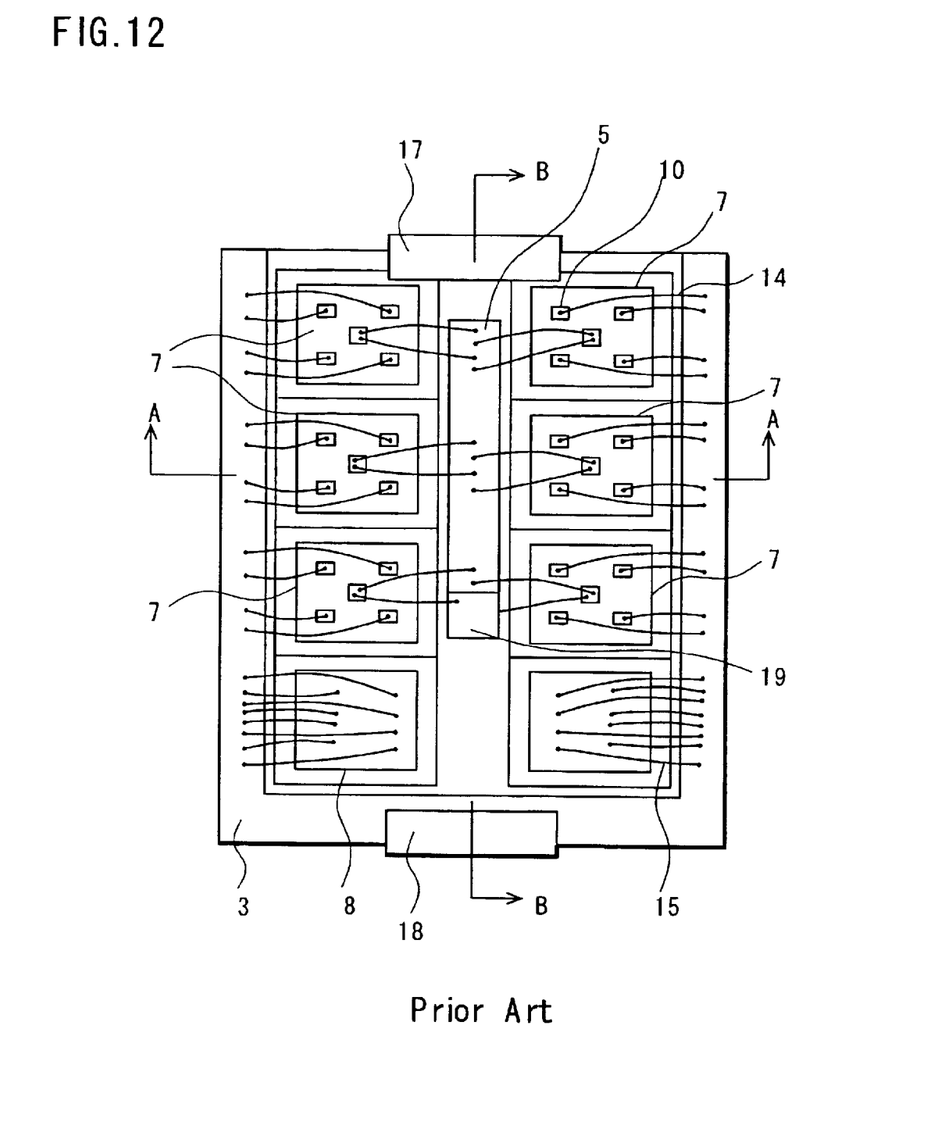
FIG. 12 is a plan view illustrating a conventional semiconductor device.
Figure 13:
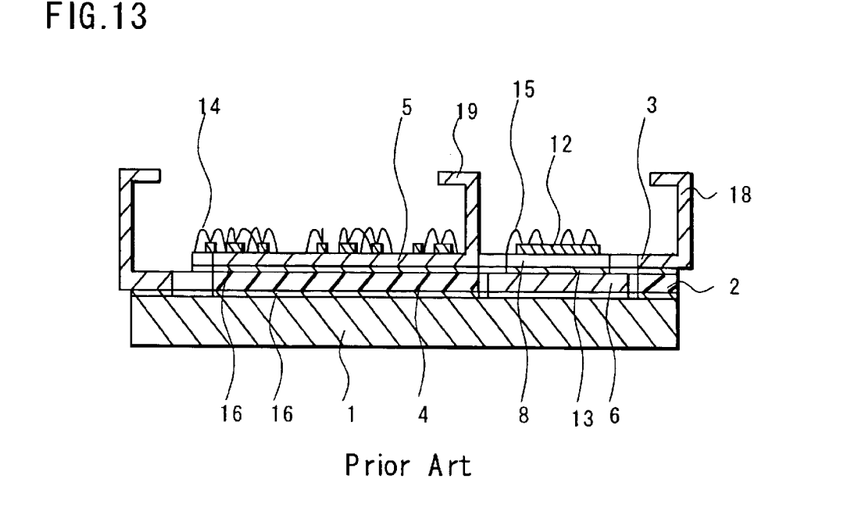
FIG. 13 is a cross-sectional view of the conventional semiconductor device of FIG. 12.
Figure 14:
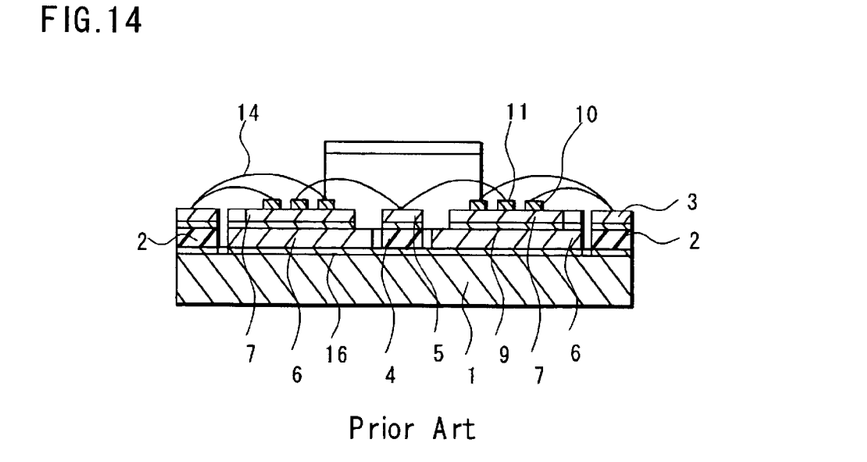
FIG. 14 is another cross-sectional view of the conventional semiconductor device of FIG. 12.

Now, referring to FIG. 12 through FIG. 14, an example of the configuration of the conventional power supply semiconductor device is briefly explained below. Here, description on the operation circuit of this semiconductor device are found in the aforementioned publication. FIG. 12 is a plan view of the semiconductor device. FIG. 13 is a cross-sectional view along line A—A of FIG. 12. FIG. 14 is a cross-sectional view along line B—B of FIG. 12.

A second electrode plate 3 is formed around the edge portions of a rectangular first electrode plate 1 made of copper, and is disposed on the first electrode plate 1 through an insulating plate 2 made of an insulating material such as alumina. On the center of the first electrode plate 1, a third electrode plate 5 is formed. The third electrode plate 5 is disposed through an insulating plate 4 made of a material such as alumina, and formed in the shape of a stripe which is aligned parallel with two of the sides of the second electrode plate 3 formed on the first electrode plate. Furthermore, a buffer plate 6 is formed on the first electrode plate 1 away from the second electrode plate 3 and the third electrode plate 5 to surround the third electrode plate 5. The buffer plate 6 is made of a metal, such as molybdenum, having a thermal expansion coefficient that is approximately equal to that of a semiconductor.

Furthermore, three rectangular IGBT (Insulated Gate Bipolar Transistor) chips 7 are fixed on the buffer plate 6 in each of the two rows, as shown in FIG. 12. Two rectangular diode chips 8 are fixed near the corners of the buffer plate 6. The IGBT chip 7 has a pair of principal surfaces, with a collector electrode 9 provided on one principal surface, and emitter electrodes 10 and a gate electrode 11 provided on the other principal surface. The collector electrode 9 is disposed so as to face the buffer plate 6. On the other hand, the diode chip 8 has a pair of principal surfaces, with an anode electrode 12 provided on one principal surface and a cathode electrode 13 provided on the other principal surface. The cathode electrode 13 is disposed so as to face the buffer plate 6.

The emitter electrodes 10 on the IGBT chips 7 are electrically connected to the second electrode plate 3 with bonding wires 14. The gate electrode 11 on the IGBT chip 7 is connected to the third electrode plate 5 with the bonding wires 14. The anode electrode 12 on the diode chips 8 is connected to the second electrode plate 3 with bonding wires 15. The semiconductor device further includes an adhesive layer 16 formed of a material such as solder, a first lead terminal 17, a second lead terminal 18, and a third lead terminal 19. These lead terminals may be integrated with the electrode plates, or they may be separately provided to combine with the corresponding electrode plates.

As described above, the conventional power supply semiconductor device is configured such that the emitter electrodes 10 on the IGBT chips 7 are connected to the second electrode plate 3 with bonding wires 14. Because many emitter electrodes 10 are formed on the IGBT chips 7, the bonding wire 14 must be connected to each of the emitter electrodes 10. Likewise, a multiple wire bonding must be performed for each of the anode electrodes 12. It should be note that the semiconductor device can provide various functions by changing the number of IGBT chips 7 and diode chips 8 that is uses.

In this configuration, to supply uniform current to the emitter region, the number of the bonding wires 14 must be the same as that of the emitter electrodes 10. Accordingly, boding must be repeated the number of times equal to the number of the bonding wires 14. For this reason, the wire bonding process needs a long process period, thus making this process inefficient.

Furthermore, to connect a plurality of emitter electrodes 10 on the IGBT chips 7 to the second electrode plate 3 with the bonding wires 14, wire bonding with beat and pressure or with ultrasonic wave must be performed. During such a bonding procedure, vibrations inevitably occur at the IGBT chips 7, thereby asserting mechanical stresses on the chips 7. As a result, repeating the bonding procedure multiple times on the same chip induces crack formation in interlayer insulating films made of a material such as silicon oxide.

SUMMARY OF THE INVENTION

The invention provides a semiconductor device including a semiconductor chip that has an electrode disposed on a primary surface of the semiconductor chip and an insulating layer disposed on the primary surface and covering a part of the electrode. The devise also includes an electrically conductive plate soldered on a part of the electrode that is not covered by the insulating layer, an electrically conductive region for external electrical connection that is disposed outside the semiconductor chip, and a conductive wire electrically connecting the electrically conductive plate and the electrically conductive region.

The invention also provides a semiconductor device including a semiconductor chip that has a current passing electrode and a control electrode each disposed on a primary surface of the semiconductor chip, and an insulating layer disposed on the primary surface and covering a part of the current passing electrode. The device also includes an electrically conductive plate soldered on a part of the current passing electrode that is not covered by the insulating layer, an electrically conductive region for external electrical connection that is disposed outside the semiconductor chip and a conductive wire electrically connecting the electrically conductive plate and the electrically conductive region.

The invention further provides a semiconductor device including a semiconductor chip that has a plurality of current passing electrodes and a plurality of control electrodes. Each of the current passing electrodes and the control electrodes is disposed on a primary surface of the semiconductor chip. The chip also includes an insulating layer disposed on the primary surface and covering a part of each of the current passing electrodes and the control electrodes. The device further includes a first electrically conductive plate soldered on a part of each of the current passing electrodes, which is not covered by the insulating layer, and a second electrically conductive plate soldered on a part of each of the control electrodes, which is not covered by the insulating layer. The device also includes a first and second electrically conductive regions for external electrical connection that are disposed outside the semiconductor chip, and a plurality of first and second conductive wires electrically connecting the first and second electrically conductive plates to the first and second electrically conductive regions.

The invention also provides a semiconductor device for use with an external device. The semiconductor device includes a semiconductor chip comprising an electrode disposed on a primary surface of the semiconductor chip and an insulating layer disposed on the primary surface and covering a part of the electrode, an electrically conductive plate soldered on a part of the electrode that is not covered by the insulating layer, and an electrically conductive wire. One end of the electrically conductive wire is fixed on the electrically conductive plate and another end of the electrically conductive wire is fixed on an electrically conductive portion of the external device.

DETAILED DESCRIPTION OF THE INVENTION

Now, the invention will be described in detail with reference to FIG. 1 through FIG. 11.

Figure 1:
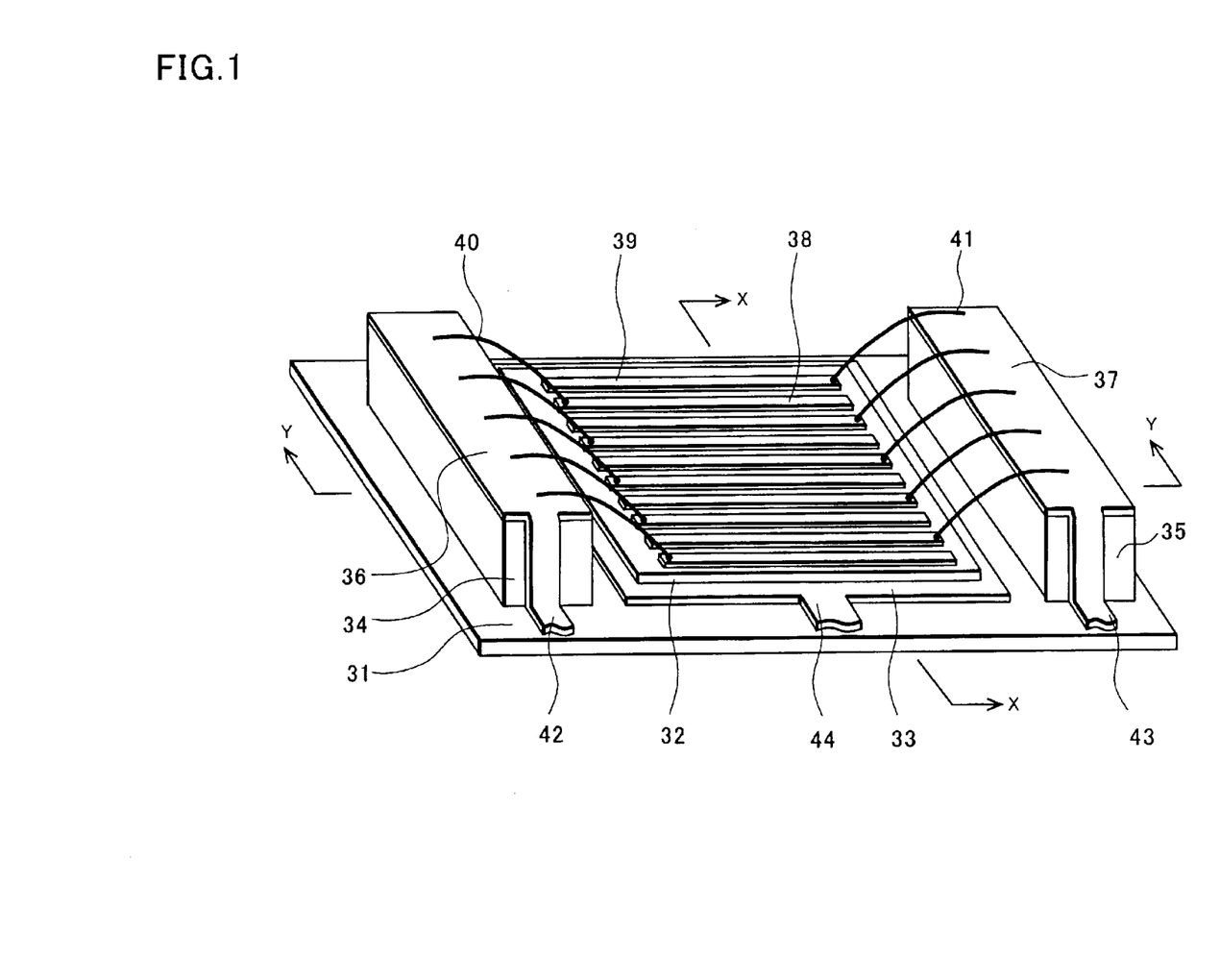
FIG. 1 is a perspective view of a semiconductor device according to a first embodiment of the invention.
Figure 2:
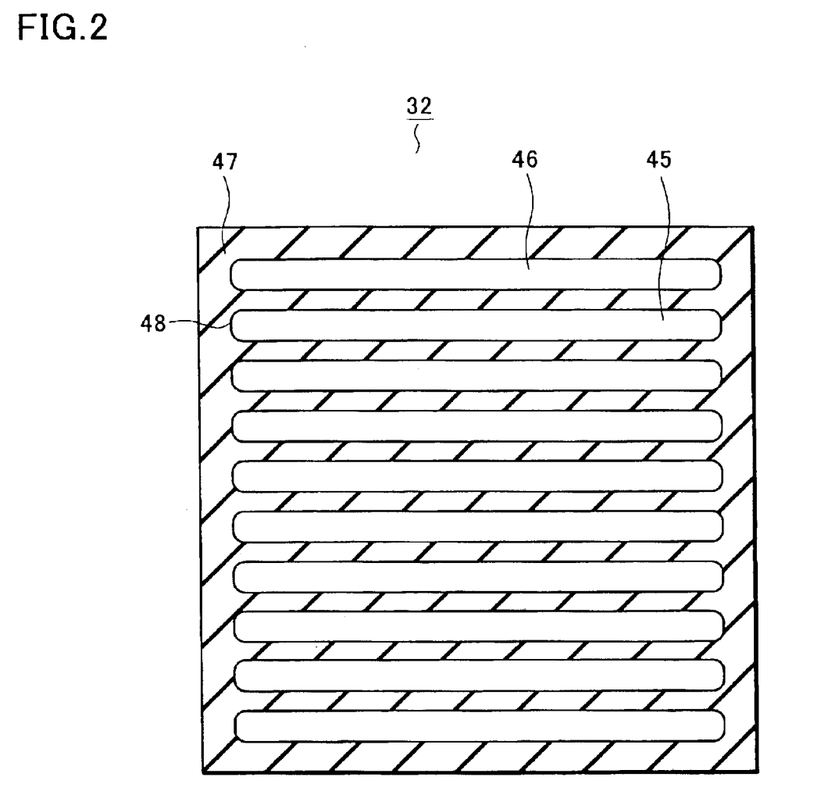
FIG. 2 is a plan view of a semiconductor chip for use with the semiconductor device of the first embodiment.
Figure 3:
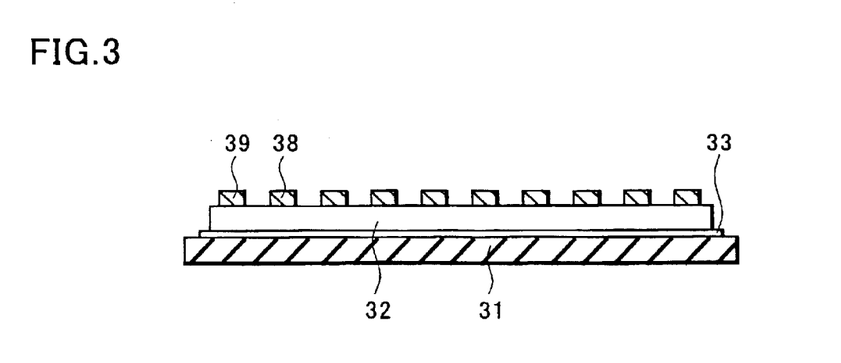
FIG. 3 is a cross-sectional view of the semiconductor device of FIG. 1 along line X—X of FIG. 1.
Figure 4:
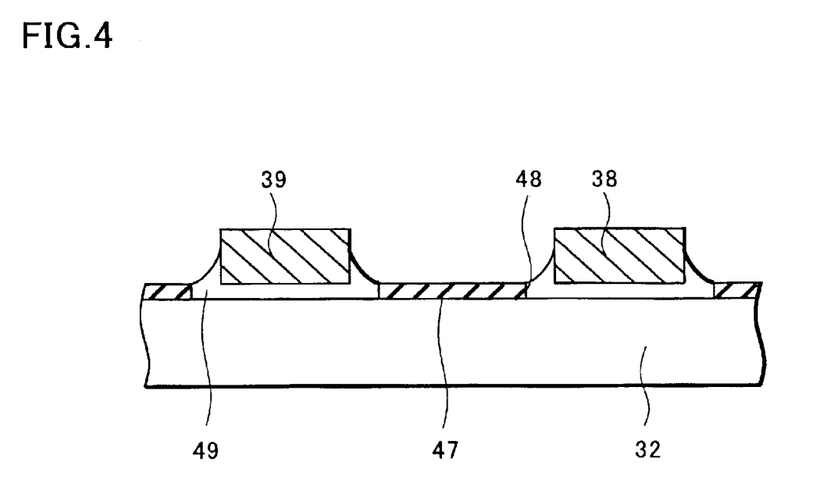
FIG. 4 is a partial expanded view of the cross-sectional view of FIG. 3.
Figure 5:
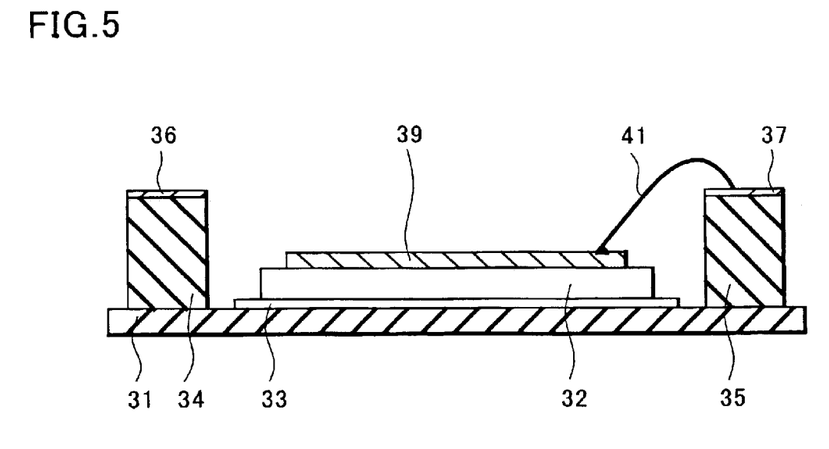
FIG. 5 is a cross-sectional view of the semiconductor device of FIG. 1 along line Y—Y of FIG. 1.

A first embodiment of the invention employs an IGBT chip which has two different types of electrodes alternately formed on a principal surface of the chip. This embodiment also applies to a GTBT (Grounded-Trench-MOS assisted Bipolar-mode FET) chip. FIG. 1 is a perspective view illustrating the basic structure of the semiconductor device according to the first embodiment. FIG. 2 is a plan view illustrating a surface of the semiconductor chip of the semiconductor device shown in FIG. 1. FIG. 3 is a cross-sectional view along line X—X shown in FIG. 1. FIG. 4 is a cross-sectional view illustrating an electrically conductive plate fixed on an electrode. FIG. 5 is a cross-sectional view along line Y—Y shown in FIG. 1.

As shown in FIG. 1, the semiconductor device of this embodiment mainly includes an insulating substrate 31, a securing region 33 that is made of an electrically conductive foil to contact a collector electrode and is provided on the insulating substrate 31 to secure the IGBT chip 32, a pair of seats 34, 35 that is made of an insulating material and is formed on both sides of the securing region 33, connection regions 36, 37 that are made of an electrically conductive foil and are formed on the seats 34, 35 for connection to emitter electrodes 45 and gate electrodes 46, electrically conductive plates 38 fixed on the emitter electrodes 45 and electrically conductive plates 39 fixed on the gate electrode 46, conductive wires 40, 41 electrically connecting the electrically conductive plates 38, 39 to the connection regions 36 and 37, and an emitter terminal 42 and a control terminal each for connecting this device to an external device. The emitter electrode and the collector electrode serve as a current passing electrode, and the gate electrode serves as a control electrode because the electric current between the emitter and collector electrodes is controlled by the signal received by the gate electrode.

Now, each component that makes up the semiconductor device of this embodiment is described below.

First, the substrate 31 is described. In this embodiment, the power supply semiconductor chip 32, which is the IGBT chip, of a current density of 300 A/cm$^2$ is mounted on the substrate 31. Because of the large heat generation by the semiconductor chip 32, a ceramic substrate is employed which has a good heat dissipation capability. Other materials that may be used as the substrate 31 include metal substrates with insulated top surface, such as a Cu substrate, an Fe substrate, and an alloy such as an Fe—Ni substrate, and an AlN (aluminum nitride) substrate. It is also possible to attach a ceramic substrate on the metal substrate.

The seats 34, 35 placed on the substrate 31 require machinability, heat dissipation, and thus is formed of a ceramic. The seats 34, 35 are disposed on both sides of the semiconductor chip 32 opposite to each other, with the surface of the seats 34 and 35 being located higher than that of the semiconductor chip 32. The structure is configured to prevent the conductive wires 40, 41 from being short-circuited on the edges of the semiconductor chip 32. In this embodiment, the connection region 36 is a copper foil that is formed on the seat 34 and extends to the emitter terminal 42. Thus, the emitter electrode 45 is connected to an external device through the conductive plate 38, the conductive wire 40, the connection region 36 and the emitter terminal 42. Similarly, the connection region 37 is formed on the seat 35 for the external connection of the gate electrode 46.

Additionally, the emitter terminal 42 is formed as one unit combined with the connection region 36. Likewise, the gate terminal 43 is formed as one unit combined with the connection region 37.

The conductive wires 40, 41 extending from the surface of the semiconductor chip 32 may also be directly connected to a conductive portion of another device external to the power supply semiconductor device. In this case, the seats 34, 35, the connection regions 36, 37, and the terminals 42, 43 may be eliminated. Only the seats 34, 35 may also be eliminated when the connection regions 36, 37 are formed directly on the insulating substrate 31. Furthermore, the semiconductor chip 32 does not have to be mounted on the insulating substrate 31, but may be mounted on a lead frame, a printed circuit board or the like to implement the wiring structure of this embodiment.

The structure of the primary surface of the semiconductor chip 32 prior to receiving the conductive plates is described below with reference to FIG. 2. There is formed an insulating layer 47 on the surface of the semiconductor chip 32, and the emitter electrodes 45 and gate electrodes 46 are exposed through holes 48 provided in the insulating layer 47. Here, the holes 48 provided in the insulating layer 47 each have an opening that extends horizontally on the surface of the semiconductor chip to form parallel lines. The holes 48 are substantially parallel in the thickness direction of the insulating layer as well. The emitter electrodes 45 and the gate electrodes 46 are exposed alternately from the corresponding holes 48. A silicon oxide film (not shown) is formed as an interlayer insulating film below the emitter electrode 45 and the gate electrode 46.

As shown in FIG. 3, the semiconductor device of this embodiment includes the feature that electrically conductive plates 38, 39, made of Cu or a Cu alloy are fixed with solder 49 (see FIG. 4) on the emitter electrodes 45 and the gate electrodes 46 exposed from the insulating layer 47 on the primary surface of the semiconductor chip 32. Each of the emitter electrodes 45 and the gate electrodes 46 receives one conductive plate.

Specifically, as shown in FIG. 1, the electrically conductive plates 38, 39 are large enough to substantially cover all of the individual emitter electrodes 45 and the gate electrodes 46 which are exposed from the holes 48, and yet small enough to be accommodated within the holes 48. The electrically conductive plates 38, 39 are fixed through the solder 49 to the emitter electrodes 45 and the gate electrodes 46 which are exposed from the holes 48 provided in the insulating layer 47 on the surface of the semiconductor chip 32. Here, the insulating layer 47 is made of a material having no solder wettability. The surface tension of the solder which is used to fix the conductive plates 36, 37 on the electrodes 45, 46 aligns the conductive plates with the corresponding electrodes within the corresponding holes without any application of external force Furthermore, because of the sizes of the electrically conductive plates and the exposed electrodes as describe above, the electrically conductive plates 38, 39 are reliably fixed on the electrodes 45, 46 with the solder over their substantially entire connection regions with the electrodes. Accordingly, in this embodiment, on the surface of the semiconductor chip 32, the electrically conductive plates 38, 39 are disposed in ten lines that are substantially parallel to each other with an equal interval.

Consequently, any two conductive plates next to each other are positioned parallel because of the self-alignment due to the surface tension of the solder. This leads to prevention of short circuits by eliminating probable contacts between the conductive plates. Furthermore, the soldering procedure of the conductive plates on the electrodes is effective and easy because of the self-alignment.

It is also possible to change the width and the thickness of the electrically conductive plates 38, 39 depending on the semiconductor chip 32 to be used or the current capacity required in an application.

Figure 6:
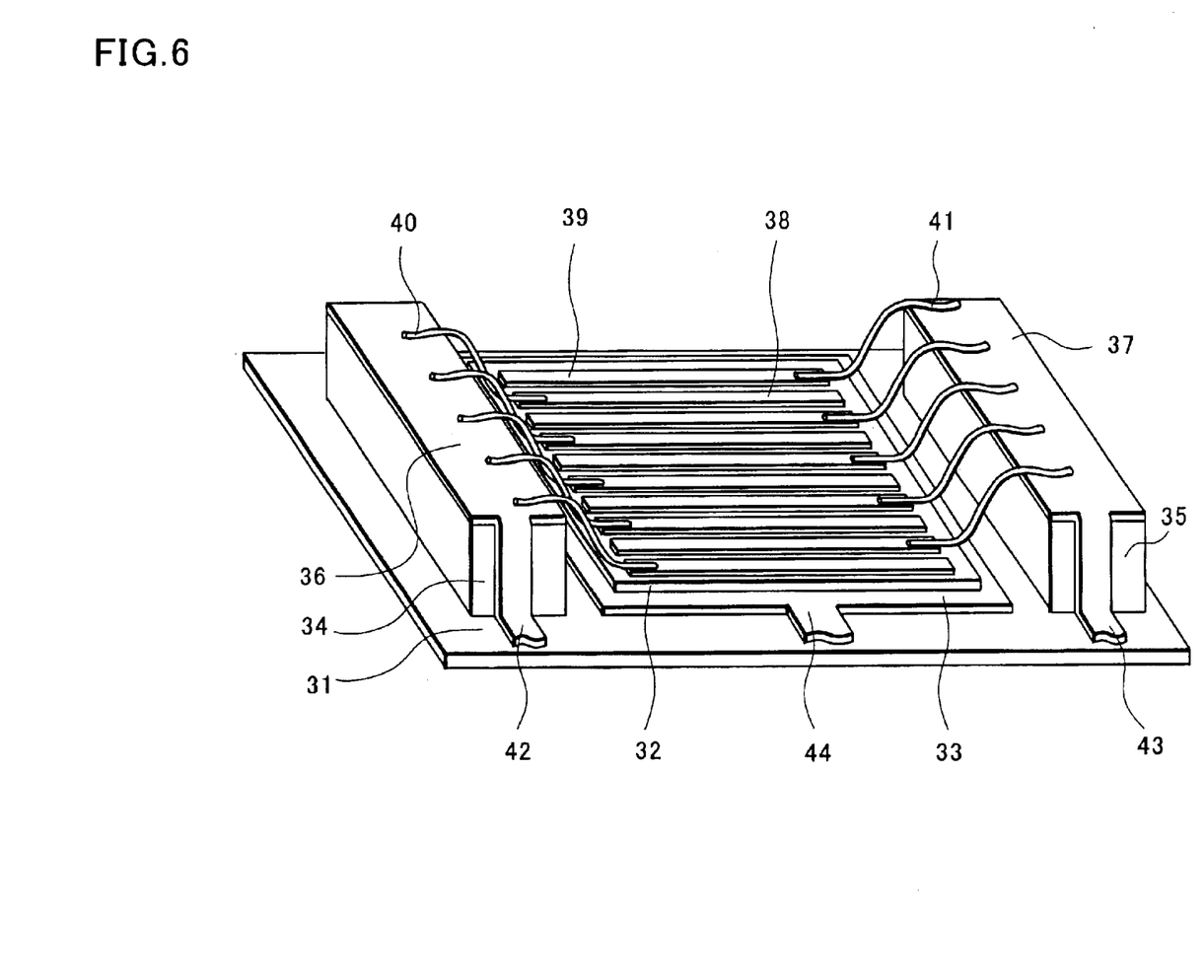
FIG. 6 is a perspective of a semiconductor device according of a modified first embodiment.

Now, as shown in FIG. 1 and FIG. 6, the semiconductor device of this embodiment has the feature that the electrically conductive plates 38, 39 fixed to the surface of the semiconductor chip 32 are electrically connected to the connection regions 36 and 37 through the conductive wires 40, 41. There are two methods available for connecting the conductive wires as described below. Structures implemented by these methods are now explained. FIG. 6 is a perspective view illustrating the basic structure of another semiconductor device of this embodiment.

A first structure is described in which a gold (Au) and an aluminum (Al) wire are used as the conductive wires 40, 41. This structure is characterized in that the electrically conductive plates 38, 39 are connected to the connection regions 36, 37 by bonding wires. More specifically, the conductive wires 40, 41, the bonding wires in this structure of the first embodiment, are bonded at the end portions of the electrically conductive plates 38, 39. In this structure, as described above, since the electrically conductive plates 38, 39 are reliably secured using solder, each impact caused by the wire bonding can be scattered over the entire plate. Therefore, according to this embodiment, the surface of the semiconductor chip 32 is not directly bonded with wires, and the electrically conductive plates 38, 39 may also serve as a buffer plate. As a result, the wire bonding procedure generates significantly reduced impact to the semiconductor chip 32. This in turn makes it possible to prevent the interlayer insulating film formed below the emitter electrode 45 and the gate electrode 46 from being cracked due to an impact caused by the wire bonding. This embodiment employs a structure in which the conductive wires 40, 41 are connected to the electrically conductive plates 38, 39 at the end portions thereof. However, it is not necessarily limited to this configuration. The same effects as described above can also be provided even when the conductive wires 40, 41 are connected to the electrically conductive plates 38, 39 at any given position. Here, the end portion of the electrically conductive plate refers to a region on the surface of the electrically conductive plate at one end of the conductive plate.

Figure 7:
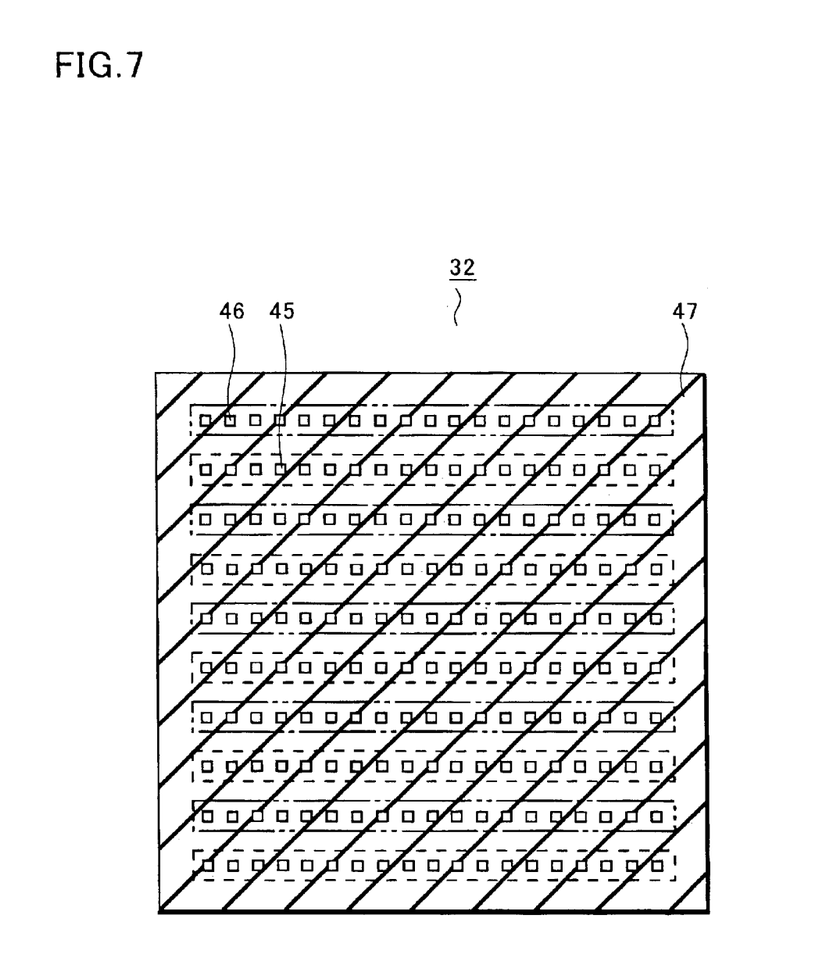
FIG. 7 is a plan of another semiconductor chip for use with the semiconductor device of the first embodiment.

Furthermore, as described above, the semiconductor device of this embodiment is configured such that the conductive wires 40, 41 are connected to the electrically conductive plates 38, 39 at their end portions. Additionally, as described above, the electrically conductive plates 38, 39 are fixed on the exposed electrodes 45, 46 with solder substantially covering the entire contact areas. This makes it possible to provide uniform current to the electrodes 45, 46 that are exposed on the surface of the semiconductor chip 32 through the insulating layer 47. For example, as shown in FIG. 7, suppose that the electrodes 45, 46 are exposed individually on the surface of the semiconductor chip 32 in the shape of a lattice pattern. Even in this case, as shown by the evenly broken lines and the unevenly broken lines, respectively, the emitter electrodes 45 in a row and the gate electrodes 46 in a row can be connected, respectively, through the electrically conductive plates 38, 39. By connecting the electrically conductive plates 38, 39 to the connection regions 36, 37 with the conductive wires 40, 41, it is possible to provide uniform current to the individual electrodes 45, 46. Additionally, it is also possible to minimize the number of times of wire bonding. As a result, the structure allows the impact exerted by the wire bonding to be significantly reduced.

Furthermore, as described above, in the semiconductor device according to this embodiment, the electrically conductive plates 38, 39 are connected to the connection regions 36, 37 with conductive wires 40, 41, respectively. This provides tolerance for some errors in the size and positioning of the connection regions 36, 37 and the semiconductor chip 32 because the conductive wires 40, 41, the bonding wires, have elasticity and ductility. As a result, for example, this structure allows the seats 34 and 35 to have a large height tolerance, thereby providing improved workability and mass-productivity in the manufacturing of the semiconductor device.

Furthermore, in this configuration, a half of the conductive wires is connected to the conductive regions on one side of the semiconductor chip, and another half of the conductive wires is connected to the connection region on another side of the semiconductor chip. This prevents the conductive wires 40, 41 from heavily populating the wire connection area, thereby providing a simplified structure to the semiconductor device.

A second structure of this embodiment employs a copper (Cu) wire as the conductive wires 40, 41. This structure is characterized in that the electrically conductive plates 38, 39 are connected to the connection regions 36, 37 with the conductive wires 40, 41 using solder. That is, such a structure is realized in which no wire bonding is employed on the surface of the semiconductor chip 32. As shown in FIG. 6, in the second structure, the electrically conductive plates 38, 39 are connected to the connection regions 36, 37 with the conductive wires 40, 41 using solder. One end of the conductive wires 40, 41 is connected to the electrically conductive plates 38, 39 at their end portions. The end portions of the electrically conductive plates 38, 39 are the same as those of the first structure. The conductive wires 40, 41 may also be fixed to the electrically conductive plates 38, 39 at any position. To improve the electrical and mechanical contact between the conductive wires 40, 41 and the electrically conductive plates 38, 39, the contact portions of the conductive wires 40, 41 and the contact portions of the electrically conductive plates 38, 39 are plated in advance, for example, with solder, Au, Ag, or Pd. It is also possible to plate the entire portions of the conductive wires 40, 41 and the electrically conductive plates 38, 39. With this structure of this embodiment, no wire is bonded on the surface of the semiconductor chip 32, thus generating no impact to the semiconductor chip 32 due to the wire bonding procedure. Consequently, no cracks occur in the interlayer insulating film formed at the lower regions of the electrodes 45, 46 of the semiconductor chip 32, thereby making it possible to provide a quality semiconductor device of high reliability.

Other effects such as those obtained by elasticity and ductility of the conductive wires 40, 41 can be provided in the same manner as in the first structure.

Finally, for example, the securing region 33 made of a copper foil is formed on the substrate 31. As described above, on the back side of the semiconductor chip 32, formed is a collector electrode (not shown), which is electrically connected to the securing region 33 using solder. A collector terminal 44 is formed as one unit combined with the securing region 33. The securing region 33 is thus connected to an external lead through the collector terminal 44.

Figure 8:
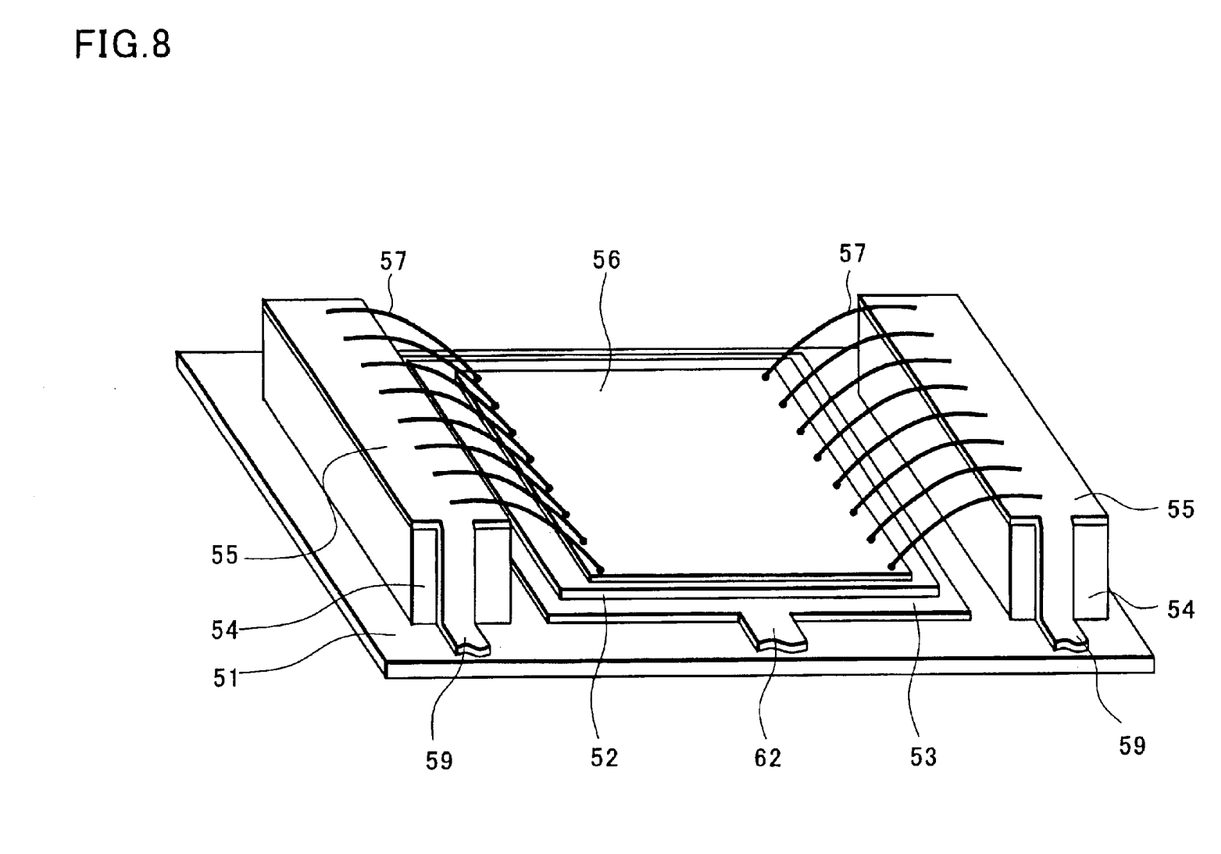
FIG. 8 is a perspective view of a semiconductor device of a second embodiment of the invention.
Figure 9:
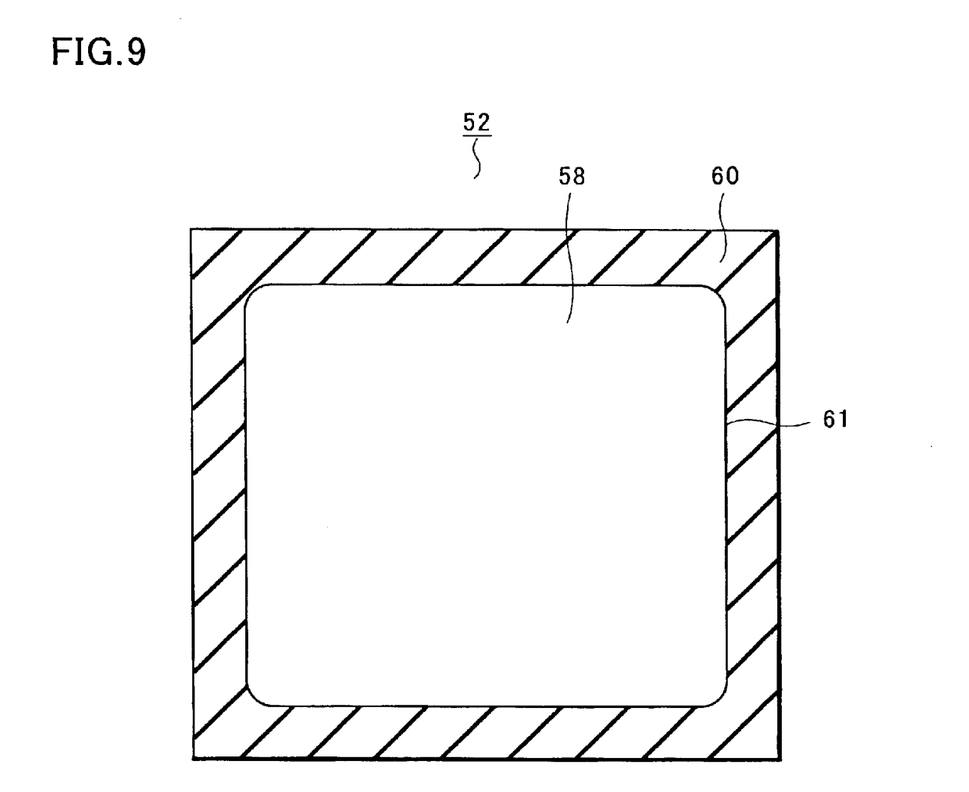
FIG. 9 is a plan view of a semiconductor chip for use with the semiconductor device of the second embodiment.

A second embodiment of the invention is described below in which a diode chip is employed. FIG. 8 is a perspective view illustrating a basic structure of a semiconductor device of this embodiment, and FIG. 9 is a plan view illustrating the surface of the semiconductor chip shown in FIG. 8. In the descriptions of this embodiment, the descriptions for the same features as in the first embodiment will not be repeated.

First, as shown in FIG. 8, the semiconductor device of this embodiment mainly includes an insulating substrate 51, a securing region 53 that is made of an electrically conductive foil to contact a cathode electrode and is disposed on the insulating substrate 51 to receive a semiconductor chip 52, a pair of seats 54 that are made of an insulating material and are formed on both sides of the securing region 53, connection regions 55, that are made of an electrically conductive foil and are formed on the seats 54 for connection to an anode electrode 58; an electrically conductive plate 56 fixed on the anode electrode 58, conductive wires 57 electrically connecting the electrically conductive plate 56 to the connection regions 55, and an anode terminal 59 for connecting the connection regions 55 to an external lead and a cathode terminal 62 for connecting the securing region 53 to an external lead.

Now, each component that makes up the semiconductor device of this embodiment is described below. Here, the insulating substrate 51, the securing region 53, the seats 54, the connection regions 55, the conductive wires 57, and the terminals 59 and 62, are the same as those described in the first embodiment.

As shown in FIG. 9, a diode chip is the semiconductor chip 52 used in this embodiment. There is formed an insulating layer 60 on the surface of the semiconductor chip 52, and an anode electrode 58 is exposed through a hole 61 provided on the insulating layer 60. On the other hand, although not illustrated, a cathode electrode is formed on the back surface of the semiconductor chip 52 and fixed to the securing region 53 using solder.

As shown in FIG. 8, the electrically conductive plate 56, for example, made of Cu or a Cu alloy, is fixed substantially on the entire surface of the anode electrode 58 using solder. In this embodiment, the surface of the semiconductor chip 52 has only one electrode, the anode electrode 58, and thus has a contact region having a size substantially equal to the anode electrode 58. And the electrically conductive plate 56 must be small enough to be accommodated in the hole 61. As in the first embodiment, the electrically conductive plate 56 is electrically connected to the connection regions 55 with the conductive wires 57, the bonding wires. For example, an Au wire or an Al wire is used as the conductive wires 57. Since the semiconductor chip 52 is connected by the conductive wires 57 to the electrically conductive plate 56, this structure allows the electrically conductive plate 56 to be used as a buffer plate to reduce the impact of the wire bonding procedure on the semiconductor chip 52. The same effects as in the first embodiment are achieved in this embodiment as well, including the size tolerance and the self-alignment. When a Cu wire is used as the conductive wires, the wire bonding process is eliminated as is the case with the structure of FIG. 6.

Figure 10:
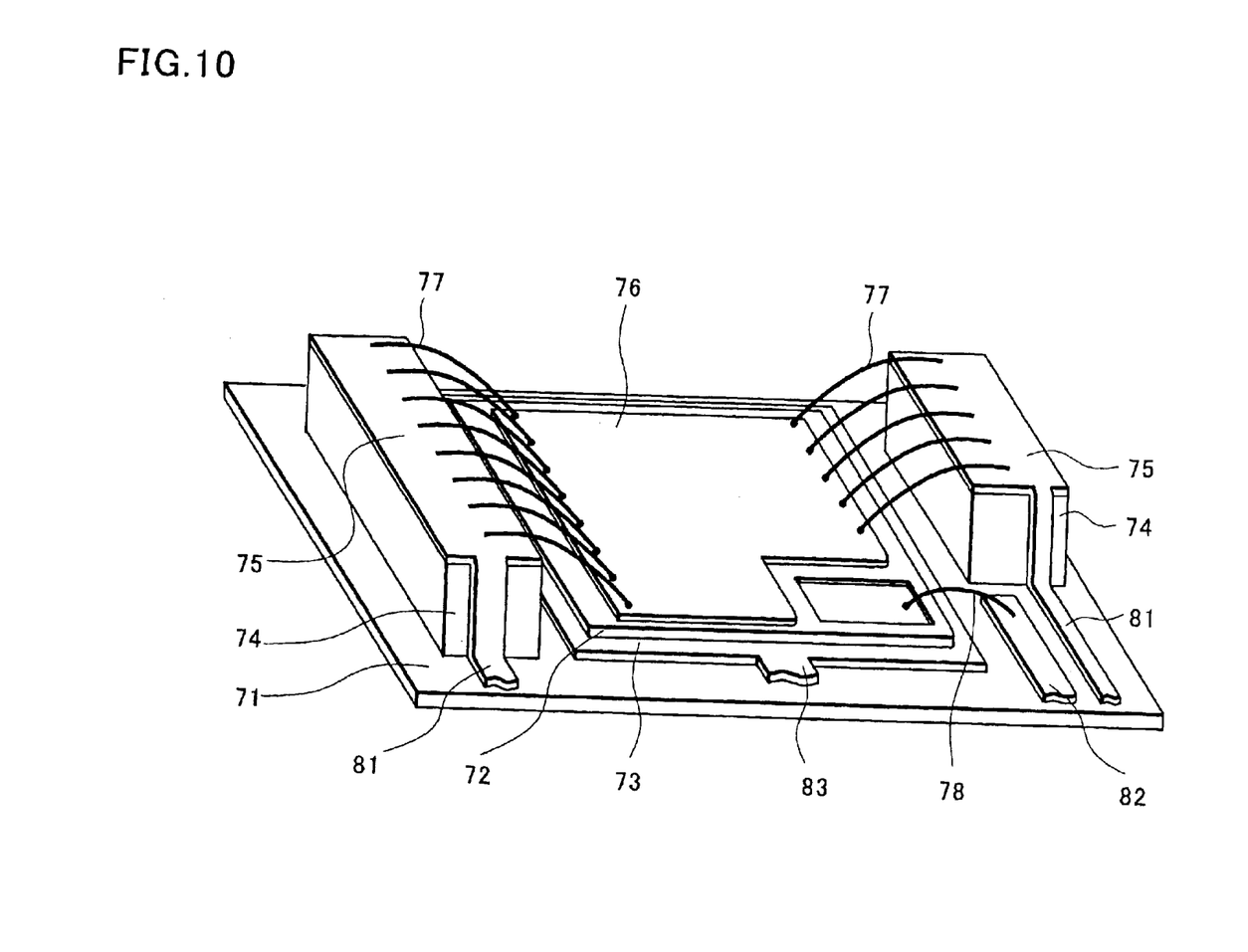
FIG. 10 is a perspective view of a semiconductor device of a third embodiment of the invention.
Figure 11:
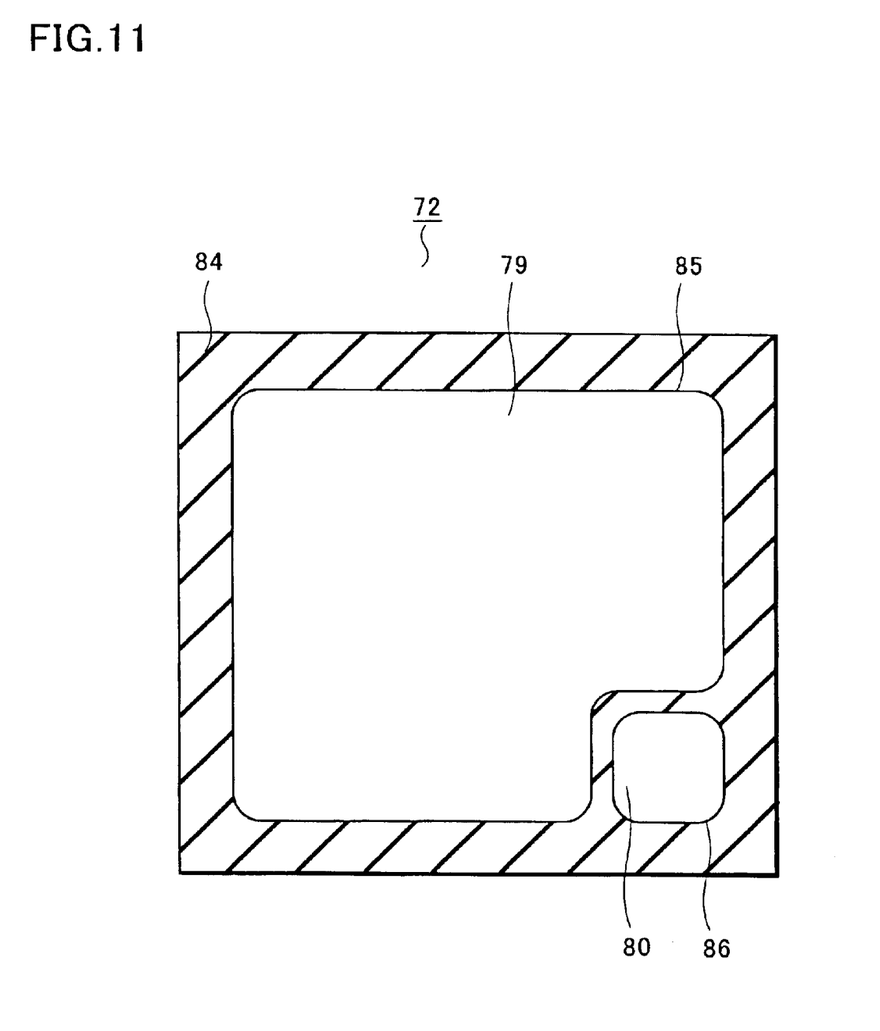
FIG. 11 is a plan view of a semiconductor chip for use with the semiconductor device of the third embodiment.

A third embodiment of the invention is described below in which a MOS (metal oxide semiconductor) transistor chip is employed. FIG. 10 is a perspective view illustrating a basic structure of a semiconductor device of this embodiment, and FIG. 11 is a plan view illustrating a primary surface of the semiconductor chip shown in FIG. 10. The descriptions for the same features as in the previous embodiments are not repeated.

First, as shown in FIG. 10, the semiconductor device of this embodiment mainly includes an insulating substrate 71, a securing region 73 that is made of an electrically conductive foil to contact a drain electrode and is fixed on the insulating substrate 71 to secure a semiconductor chip 72, a pair of seats 74 that are made of an insulating material and are formed on both sides of the securing region 73 for contact to a source electrode 79, connection regions 75 that are made of an electrically conductive foil and are formed on the seats 74, an electrically conductive plate 76 fixed on the source electrode 79, conductive wires 77 electrically connecting the electrically conductive plate 76 to the connection regions 75, a source terminal 81 for connecting the connection regions 75 to an external lead, and a conductive wire 78 electrically connecting a gate electrode 80 and a gate terminal 82. The source electrode and the drain electrode serve as a current passing electrode, and the gate electrode serves as a control electrode because the electric current between the source and drain electrodes is controlled by the signal received by the gate electrode.

Now, each component that makes up the semiconductor device of this embodiment is described below. Here, the insulating substrate 71, the securing region 73, the seats 74, the connection regions 75, the conductive wires 77 and 78, and the terminals 81, 82, 83 re the same as those in the previous embodiments.

As shown in FIG. 10, in this embodiment, a MOS transistor is employed as the semiconductor chip 72. An insulating layer 84 is formed on the surface of the semiconductor chip 72, and holes 85 and 86 are formed in the insulating layer 84. A hole 85 exposes the source electrode 79 and occupies most of the surface of the semiconductor chip 72. The hole 86 exposes the gate electrode 80 and occupies only a small part of the surface of the semiconductor chip 72. Although not illustrated, a drain electrode is formed on the back surface of the semiconductor chip 72 and fixed on the securing region 73.

As shown in FIG. 10, the electrically conductive plate 76, made of Cu or a Cu alloy, is fixed substantially on the entire surface of the source electrode 79 using solder. In this embodiment, the surface of the gate electrode 80 receives no electrically conductive plate, the gate electrode 80 and the gate terminal 82 are directly with the conductive wire 78. Alternatively, an electrically conductive plate may also be fixed on the surface of the gate electrode 80 for connection between the gate electrode and the gate terminal.

The surface of the semiconductor chip 72 has a contact region having a size substantially equal to the source electrode 79. And the electrically conductive plate 76 is small enough to be accommodated in the hole 85. As in the first embodiment, the electrically conductive plate 76 is electrically connected to the connection regions 75 with the conductive wires 77 by wire bonding. For example, a Au wire or an Al wire is used as the conductive wires 77 and 78. Since the conductive wires 77 are wire bonded to the electrically conductive plate 76, the conductive plate 76 serves as a buffer plate to reduce the impact of the wire bonding on the semiconductor chip 72. The same effects as in the previous embodiments are achieved in this embodiment as well, including the size tolerance and the self-alignment. When a Cu wire is used as the conductive wires, the wire bonding process is eliminated as is the case with the structure of FIG. 6.

The above is a detailed description of particular embodiments of the invention which is not intended to limit the invention to the embodiments described. It is recognized that modifications within the scope of the invention will occur to persons skilled in the art. Such modifications and equivalents of the invention are included within the scope of this invention.

What is claimed is:

1. A semiconductor device comprising:
   a semiconductor chip comprising a plurality of current passing electrodes and a plurality of control electrodes, each of the current passing electrodes and the control electrodes being disposed on a primary surface of the semiconductor chip, and an insulating layer disposed on the primary surface and covering a part of each of the current passing electrodes and the control electrodes;
   a first electrically conductive plate soldered on a part of each of the current passing electrodes, said part of the current passing electrode not being covered by the insulating layer;
   a second electrically conductive plate soldered on a part of each of the control electrodes, said part of the control electrode not being covered by the insulating layer;
   a first electrically conductive region for external electrical connection that is disposed outside the semiconductor chip;
   a second electrically conductive region for external electrical connection that is disposed outside the semiconductor chip;
   a plurality of first conductive wires electrically connecting the first electrically conductive plates to the first electrically conductive region; and
   a plurality of second conductive wires electrically connecting the second electrically conductive plates to the second electrically conductive region.

2. The semiconductor device of claim 1, wherein the first and second conductive wires are made of copper and are soldered to the corresponding first and second electrically conductive plates.

3. The semiconductor device of claim 1, wherein the first and second conductive wires are made of gold or aluminum and are wire-bonded to the corresponding first and second electrically conductive plates.

4. The semiconductor device of claim 1, wherein the first and second electrically conductive plates are arranged parallel so that the first electrically conductive plates are interposed between the corresponding second electrically conductive plates.

5. The semiconductor device of claims 1, 2 or 3, wherein the first and second electrically conductive regions comprise an electrically conductive foil.

6. The semiconductor device of claim 1, wherein the first and second conductive wires are connected to top surfaces of the corresponding first and second electrically conductive regions.

7. The semiconductor device of claim 1, wherein the first and second electrically conductive plate comprise a copper plate.

* * * * *